Figure 1:
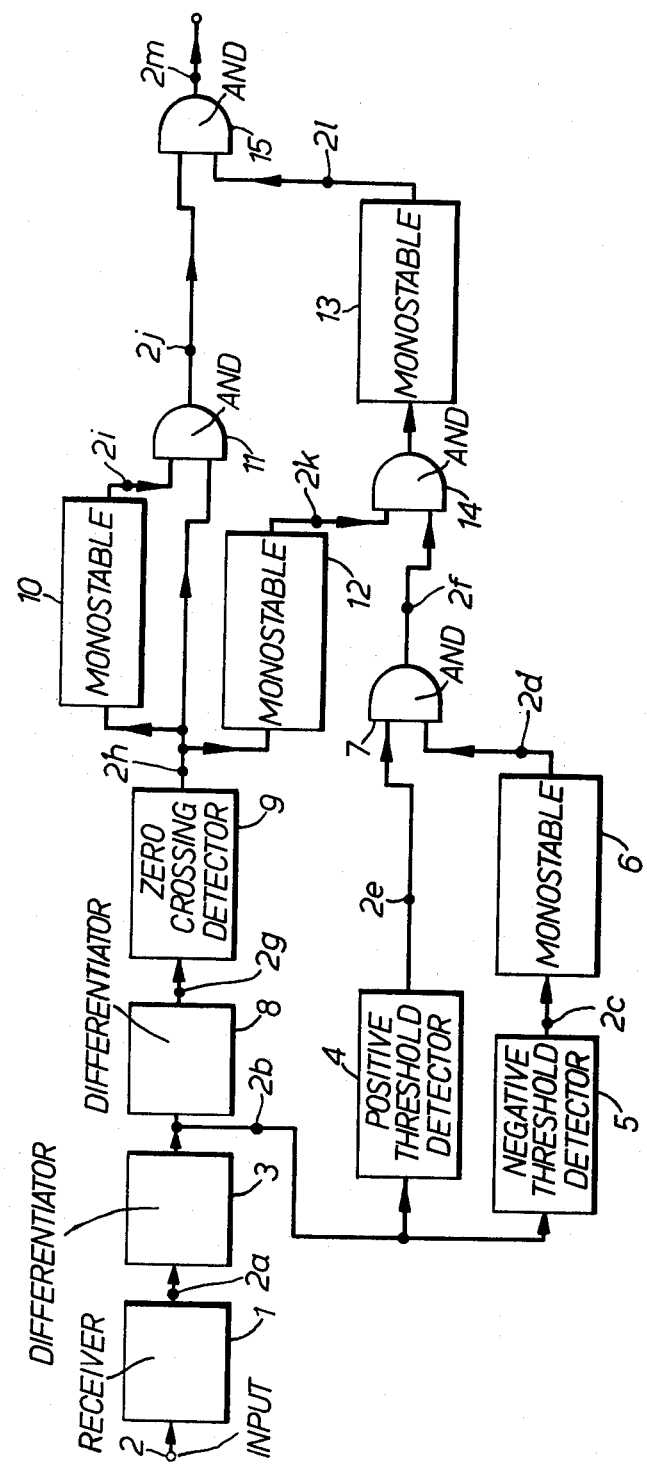

United States Patent [19]

Dawson

[11] 4,318,047
[45] Mar. 2, 1982

[54] DETECTION OF NARROW PULSES
[75] Inventor: John H. Dawson, Chelmsford, England
[73] Assignee: The Marconi Company Limited, Chelmsford, England
[21] Appl. No.: 35,402
[22] Filed: May 2, 1979
[30] Foreign Application Priority Data
May 30, 1978 [GB] United Kingdom ............... 23752/78
[51] Int. Cl.³ .......................... G01R 29/02; G01S 3/78
[52] U.S. Cl. .................................... 328/112; 307/234; 307/265
[58] Field of Search ....................... 328/109, 111, 112; 307/234, 265

[56] References Cited
U.S. PATENT DOCUMENTS
2,489,297  11/1949  Labin et al. .......................... 328/111
3,230,461   1/1966  Dix et al. ............................. 328/112
3,600,688   8/1971  Booth .................................. 328/112

Primary Examiner—Stanley D. Miller, Jr.
Assistant Examiner—B. P. Davis
Attorney, Agent, or Firm—Diller, Ramik & Wight

[57] ABSTRACT

The invention is concerned with the detection of the presence of narrow pulses in an electrical signal such as that derived from a limited band width receiver. A first discriminator is provided for discriminating against pulses other than those having a ratio of amplitude to width characteristic of a desired narrow pulse. A second discriminator is provided for discriminating against pulses other than those having a width characteristic of a desired narrow pulse and a third discriminator is provided for discriminating against pulses other than those which have a symmetry characteristic of a desired narrow pulse. The input is applied to the first and second discriminators in parallel with the third discriminator arranged to be effective only for those pulses which have not been discriminated against by the first and second discriminators.

10 Claims, 2 Drawing Figures 2a
  2b
  2c
  2d
  2e
  2f
  2g
  2h
  2i
  2j
  2k
  2l
  2m

DETECTION OF NARROW PULSES

This invention relates to arrangements for detecting the presence of narrow pulses and in particular for detecting narrow positive going pulses in the output of a limited bandwidth receiver.

The output of a limited bandwidth receiver particularly one utilised with an optical or infra-red scanning system commonly includes relatively narrow positive going pulses together with wider pulses and/or edges and random noise voltages having a frequency spectrum approximately inverse with frequency. The relatively narrow positive going pulses in such cases represent small targets seen against a coarse background structure.

The present invention seeks to provide an improved arrangement for detecting such relatively narrow pulses.

According to this invention an arrangement for detecting the presence of narrow pulses in an electrical signal comprises means for discriminating against pulses in said electrical signal other than those having a ratio of amplitude to width characteristic of a desired narrow pulse, means for discriminating against pulses in said waveform other than those having a width characteristic of a desired narrow pulse and means for discriminating against pulses in said waveform other than those which have a symmetry characteristic of desired narrow pulses.

Preferably means are provided for subjecting said electrical signal to said first mentioned and second mentioned discriminating means in parallel, and said arrangement is such that said third mentioned discriminator means are effective for pulses in said electrical signal which have not been discriminated against by said first and second mentioned discriminator means.

Preferably a first differentiator is provided to which said electrical signal may be applied and means are provided for discriminating against pulses in the output of said first discriminator, which fail to pass from a negative threshold to a positive threshold within a predetermined time corresponding to pulses in said electrical signal, which are other than those having a ratio of amplitude to width characteristic of a desired narrow pulse.

Preferably said last mentioned means comprises a positive threshold detector and a negative threshold detector both connected to derive input signals from said first differentiator, said negative threshold detector being connected to trigger a monostable circuit the output of which is connected to an AND gate a second input for which is connected to the output of said positive threshold detector, whereby, in operation, if, after said monostable circuit is triggered by said negative threshold detector, the threshold of said positive tput of which is connected to a zero crossing detector, the output of said zero crossing detector being connected both to trigger a monostable circuit and to the input of an AND gate, a second input for which is derived from the output of said last mentioned monostable circuit, whereby if, following triggering of said last mentioned monostable circuit by said zero crossing detector, the output of said zero crossing detector returns high before said last mentioned monostable circuit lapses, an output pulse appears at the output of said last mentioned AND gate.

Preferably again the output of said zero crossing detector is connected to trigger simultaneously with said last mentioned monostable circuit, a further monostable circuit, the output of which is connected to one input of a further AND gate, a second input for which is derived from the output of said first mentioned AND gate, the output of said further AND gate being connected to trigger a yet further monostable circuit the output of which is connected to one input of an output AND gate a second input for which is connected to the output of that AND gate, which derives an input from the output of said zero crossing detector, whereby an output pulse appears at the output of said output AND gate if an output pulse appears at the output of that AND gate which derives an input from the output of said zero crossing detector before said yet further monostable circuit lapses following triggering by said zero crossing detector.

Figure 2:
Figure 2:
Figure 2:
Figure 2:
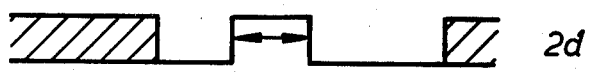
Figure 2:
Figure 2:
Figure 2:
Figure 2:
Figure 2:
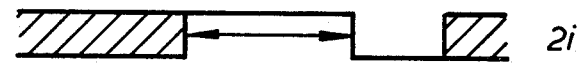
Figure 2:
Figure 2:
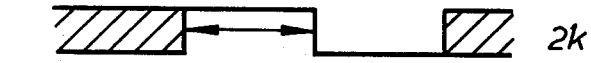
Figure 2:
Figure 2:
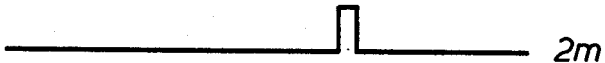

The invention is illustrated in and further described with reference to the accompanying drawings in which, FIG. 1 is a block schematic diagram of one circuit arrangement for detecting relatively narrow positive going pulses in the presence of wider pulses, edges and random noise voltages having a frequency spectrum approximately inverse with frequency and FIG. 2 shows explanatory waveform diagrams 2a to 2m representative of the waveforms present at correspondingly referenced points in the circuit diagram of FIG. 1.

Referring to FIG. 1, a limited bandwidth receiver 1 is provided to derive at 2 an input from an infra-red scanning system (not shown). The limited bandwidth receiver 1 is arranged to have a roughly Gaussian frequency response so that the pulse generated by a required small target is as shown at 2a in FIG. 2.

The output of receiver 1 is connected to a first differentiator 3, which provides at its output in response to the waveform 2a relating to a wanted small target, the waveform as shown at 2b in FIG. 2.

In order to qualify as a required small target or in other words, in order to qualify as a required relatively narrow pulse, the differentiator waveform 2b at the output of differentiator 3 must pass from a negative threshold to a positive threshold within a predetermined time. This is a measure of the amplitude of the second differentiator near the pulse center and this provides optimum detection in an inverse frequency noise voltage spectrum as known per se. In order to perform a test of this, the waveform 2b at the output of differentiator 3 is applied in parallel to the inputs of a positive threshold detector 4 and a negative threshold detector 5. The output of negative threshold detector 5 is connected to control the starting of a monostable circuit 6, the output of which is connected to one input of an AND gate 7, the second input for which is derived from the output of the positive threshold detector 4.

In operation, the negative going edge of the negative threshold detection at the output of negative threshold detector 5 as shown at 2c in FIG. 2 starts monostable circuit 6, the output of which is as shown at 2d in FIG. 2. If the output of the positive threshold detector 4, as shown at 2e in FIG. 2, is exceeded before monostable circuit 6 lapses then, at the output of the AND gate 7, a detection pulse is obtained which is as shown at 2f in FIG. 2. In practice, the thresholds of positive threshold detector 4 and negative threshold detector 5 would be adjustable so that these may be set in accordance with a typical false alarm rate in any particular case. When so set, the thresholds may quite frequently be exceeded by noise, but a combination of spurious events producing a detection pulse as shown at 2f will be rare.

The detection circuits 4, 5, 6 and 7 itself provides some rejection of relatively wide pulses, but further discrimination is additionally provided. The output waveform 2b of the first differentiator 3 is connected to a second discriminator 8, which in response to a waveform such as 2b produces a second differential waveform as shown at 2g. The zero crossings of this second differential waveform 2g represent the points of inflection of the original pulse waveform 2a.

The output of the second differentiator 8 is connected to a zero crossing detector 9 which, from the waveform 2g at its input, produces the waveform 2h as shown in FIG. 2. The output of zero crossing detector 9 is connected to a monostable circuit 10 and to one input terminal of an AND gate 11. AND gate 11 derives a second input directly from the output of the zero crossing detector 9. The negative going edge of the zero crossing detector output waveform 2h starts or re-triggers monostable circuit 10 to produce the waveform 2i shown in FIG. 2. If the output 2h of the zero crossing detector returns high before monostable circuit 10 has lapsed, then a narrow event is indicated at the output of AND gate 11 as shown in waveform 2j in FIG. 2. However, outputs of this last mentioned type are also produced by noise and therefore monostable circuit 10 is arranged to be re-triggerable in order to make a correct start with any prospective narrow pulse.

Thus far, detection has been provided by circuits 4, 5, 6 and 7 and confirmation of a narrow pulse has been provided by circuits 8, 9, 10 and 11. However, certain combinations of noise and edge signals might still have passed these tests and thus represent this as required narrow signals. In order to overcome this difficulty, a further, symmetry, test is applied involving two further monostable circuits referenced 12 and 13 respectively.

Monostable circuit 12 derives an input (waveform 2h) from the output of zero crossing detector 9 and is again triggered by a negative going edge and indeed, is triggered simultaneously with monostable circuit 10. This provides the waveform 2k of FIG. 2 at the output of monostable circuit 12. The output of monostable circuit 12 is connected to one input of an AND gate 14, a second input for which is derived from the output (waveform 2f) of AND gate 7. The output of monostable circuit 13 is applied to one input of an AND gate 15, a second input for which is derived from the output (waveform 2j of AND gate 11).

The result of AND gate 14 is that so long as "detection" (waveform 2f at the output of AND gate 7) occurs before monostable circuit 12 (output waveform 2k) has lapsed, then monostable circuit 13 will be triggered by the output of AND gate 14 to provide the output waveform 2l of FIG. 2.

The effect of AND gate 15 is that so long as confirmation of a narrow pulse (output waveform 2j at the output of AND gate 11) occurs before monostable circuit 13 has lapsed (waveform 2l) then a final output appears at the output of AND gate 15, which is the waveform 2m of FIG. 2.

Thus, the effect of the circuitry 12, 13, 14 and 15 is to check that detection (waveform 2f) has occurred near the center of the width measurement pulse (waveform 2i) and that the symmetry characteristic of a correction detection is present.

The effective width of receiver input pulses which result in an output extends up to approximately the duration of monostable circuit 10. Monostable circuit 10 can be set as narrow as 0.38 $B^{-1}$ where B is the 3 dB bandwidth of the receiver. Monostable circuit 6 would then typically be set at 0.1 $B^{-1}$ with monostable circuits 12 and 13 set at about 0.2 $B^{-1}$.

I claim:

1. An electronic circuit arrangement for detecting the presence of sharply peaked, relatively narrow, Gaussian pulses in an electrical waveform signal of the sort emanating from a limited bandwidth receiver having low pass filter characteristics, which arrangement comprises: differentiator means connected to said electrical waveform signal for producing the first and the second differentials, with respect to time, of said electrical waveform signal; pulse curvature discriminating means responsive to said first differential of the electrical waveform signal for discrimination against pulses in the waveform having a curvature less sharp than that sharp peak curvature characteristic of a desired pulse; pulse width discriminating means responsive to said second differential of the electrical waveform signal for discriminating against pulses in the waveform having a width greater than that width characteristic of a desired pulse; and pulse symmetry discriminating means responsive to said pulse curvature discriminating means and to said second differential for discriminating against pulses in the waveform which are not roughly symmetrical about their peak value, and thus which do not have a symmetry characteristic of a desired pulse;

which arrangement is such that the pulse curvature and pulse width discriminating means are provided in parallel, and the pulse symmetry discriminating means is serially thereafter, and is thus effective for pulses in the waveform which have not yet been discriminated against.

2. An electronic circuit arrangement for detecting the presence of sharply peaked, relatively narrow, Gaussian pulses in an electrical waveform signal of the sort emanating from a limited bandwidth receiver having low pass filter characteristics, which arrangement comprises: pulse curvature discriminating means for discriminating against pulses in the waveform having a curvature less sharp than that sharp peak curvature characteristic of a desired pulse; pulse width discriminating means for discriminating against pulses in the waveform having a width greater than that width characteristic of a desired pulse; and pulse symmetry discriminating means for discriminating against pulses in the waveform which are not roughly symmetrical about their peak value, and thus which do not have a symmetry characteristic of a desired pulse;

which arrangement is such that the pulse curvature and pulse width discriminating means are provided in parallel, and the pulse symmetry discriminating means is serially thereafter, and is thus effective for pulses in the waveform which have not yet been discriminated against, the pulse curvature discriminating means including a first differentiator to which the input waveform is applied, and a first timing means for discriminating against pulses in the output of this first differentiator which fail to pass from a negative threshold level to a positive threshold level within a predetermined time related to the sharp peak curvature it connected to derive input trigger signals from the negative threshold detector, and a first AND gate the first input of which is the first monostable's output and the second input of which is the output of the positive threshold detector.

3. An arrangement as claimed in claim 2, wherein the pulse width discriminating means employs a second differentiator (deriving its input from the first differentiator) and a second timing means to discriminate against pulses in the output of the second differentiator which are too wide, which second timing means is the combination of a zero crossing detector deriving its input from the second differentiator, a second monostable circuit triggered by the output of the zero crossing detector, and a second AND gate deriving its first input from the zero crossing detector and its second input from the output of the second monostable.

4. An arrangement as claimed in claim 3, wherein the pulse symmetry discriminating means is a third timing means which discriminates against input pulses which are not roughly symmetrical about their peak value, which third timing means is the combination of a third monostable circuit (also triggered by the output of the zero crossing detector), a third AND gate the first input of which is the third monostable's output and the second input of which is derived from the output of the first AND gate, a fourth monostable circuit triggered by the output of the third AND gate, and finally a fourth AND gate the first input of which is the fourth monostable's output and the second input of which is connected to the output of the second AND gate (the one which derives one of its inputs from the output of the zero crossing detector).

5. In an electronic circuit for detecting, in an input signal, the presence of narrow pulses while discriminating against other pulses which do not have all of the characteristics of amplitude to width ratio, width and symmetry of said narrow pulses, the combination of:
   first means for determining if the time period required, for a first differential of an input signal pulse, to pass between predetermined positive and negative values is less than a first predetermined value and for producing a first pulse signal when said time period is less than said first predetermined value;
   second means for determining if the time period required, for a second differential of said pulse, to pass from a first to a second zero crossing is less than a second predetermined value and for producing a second pulse signal when such time period is less than said second predetermined value;
   third means for determining if said first pulse signal occurs within a further time period, of a third predetermined value, commencing at the instant of said first zero crossing and for producing a third pulse signal when said first pulse signal occurs within said further time period; and
   pulse generating means for producing a narrow output pulse when said second pulse signal occurs within another time period of a fourth predetermined value commencing with said third pulse signal.

6. In an electronic circuit as defined in claim 5 wherein said input signal is derived from a limited bandwidth receiver having a 3 dB bandwidth B, said first predetermined value being about $0.1\ B^{-1}$, said second predetermined value being about $0.38\ B^{-1}$, and said third and fourth predetermined values being about $0.2\ B^{-1}$.

7. In an electronic circuit as defined in claim 5 or 6 wherein said first means comprises a positive threshold detector and a negative threshold detector, a timing circuit connected to one of said detectors for providing a pulse having a duration equal to said first predetermined value, and a circuit for ANDing signals from said timing circuit and the other detector to produce said first pulse signal.

8. In an electronic circuit as defined in claim 7 wherein said second means comprises a second timing circuit for providing a pulse having a duration equal to said second predetermined value and a circuit for ANDing the signal from said second timing circuit and a signal indicating said second zero crossing to produce said second pulse signal.

9. In an electronic circuit as defined in claim 8 wherein said third means comprises a third timing circuit for providing a pulse having a duration equal to said third predetermined value and a circuit for ANDing the signal from said third timing circuit and said first pulse signal to produce said third pulse signal.

10. In an electronic circuit as defined in claim 9 wherein said pulse means comprises a timing circuit responsive to said third pulse signal for providing a pulse having a duration equal to said third predetermined value and a circuit for ANDing said pulse equal to said third predetermined value and said second pulse signal to produce said narrow output pulse.

* * * * *